United States Patent
Kalita et al.

(10) Patent No.: US 11,834,744 B2
(45) Date of Patent: Dec. 5, 2023

(54) CERAMIC SHOWERHEADS WITH CONDUCTIVE ELECTRODES

(71) Applicant: Applied Materials, Inc., Santa Clara, CA (US)

(72) Inventors: Laksheswar Kalita, San Jose, CA (US); Soonam Park, Sunnyvale, CA (US); Dmitry Lubomirsky, Cupertino, CA (US); Tien Fak Tan, Campbell, CA (US); LokKee Loh, San Francisco, CA (US); Saravjeet Singh, Sunnyvale, CA (US); Tae Won Kim, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/173,704

(22) Filed: Feb. 23, 2023

(65) Prior Publication Data
US 2023/0203657 A1    Jun. 29, 2023

Related U.S. Application Data

(60) Continuation of application No. 17/176,411, filed on Feb. 16, 2021, now Pat. No. 11,591,693, which is a
(Continued)

(51) Int. Cl.
*H01J 37/32* (2006.01)
*C23C 16/455* (2006.01)
(Continued)

(52) U.S. Cl.
CPC ........ *C23C 16/45565* (2013.01); *C23C 16/34* (2013.01); *C23C 16/4581* (2013.01);
(Continued)

(58) Field of Classification Search
CPC .............. C23C 16/45565; C23C 16/34; C23C 16/45574; C23C 16/4581; C23C 16/4404;
(Continued)

(56) References Cited

U.S. PATENT DOCUMENTS 6,334,983 B1 * 1/2002 Okayama .............. C23C 16/455
156/345.47
7,196,283 B2 * 3/2007 Buchberger, Jr. ..........................
H01J 37/32082
219/121.52

(Continued)

FOREIGN PATENT DOCUMENTS

JP            6739940 B2    8/2020

*Primary Examiner* — Rudy Zervigon
(74) *Attorney, Agent, or Firm* — Kilpatrick Townsend & Stockton LLP

(57) ABSTRACT

Exemplary semiconductor processing chamber showerheads may include a dielectric plate characterized by a first surface and a second surface opposite the first surface. The dielectric plate may define a plurality of apertures through the dielectric plate. The dielectric plate may define a first annular channel in the first surface of the dielectric plate, and the first annular channel may extend about the plurality of apertures. The dielectric plate may define a second annular channel in the first surface of the dielectric plate. The second annular channel may be formed radially outward from the first annular channel. The showerheads may also include a conductive material embedded within the dielectric plate and extending about the plurality of apertures without being exposed by the apertures. The conductive material may be exposed at the second annular channel.

20 Claims, 10 Drawing Sheets

Related U.S. Application Data division of application No. 16/245,698, filed on Jan. 11, 2019, now Pat. No. 10,920,319.

(51) Int. Cl.
| | |
|---|---|
| *C23C 16/34* | (2006.01) |
| *H01L 21/3213* | (2006.01) |
| *H01L 21/285* | (2006.01) |
| *C23C 16/458* | (2006.01) |

(52) U.S. Cl.
CPC .. *C23C 16/45574* (2013.01); *H01J 37/32495* (2013.01); *H01J 37/32559* (2013.01); *H01L 21/28512* (2013.01); *H01L 21/3213* (2013.01)

(58) Field of Classification Search
CPC ............... C23C 16/50; H01J 37/32495; H01J 37/32559; H01L 21/28512; H01L 21/3213; H01L 21/6719; H01L 21/3065; H01L 21/68785
USPC ..... 118/723 E, 723 ER; 156/345.43, 345.44, 156/345.45, 345.46, 345.47; 427/569, 427/570, 535, 96.8, 237, 248.1, 255.23, 427/255.28; 216/58, 67
See application file for complete search history.

(56) References Cited

U.S. PATENT DOCUMENTS

| | | | |
|---|---|---|---|
| 10,755,900 B2 * | 8/2020 | Tran ................. | C23C 16/45565 |
| 2004/0058070 A1 * | 3/2004 | Takeuchi ................. | C23C 4/01 |
| | | | 427/446 |

* cited by examiner

CERAMIC SHOWERHEADS WITH CONDUCTIVE ELECTRODES

CROSS-REFERENCE TO RELATED APPLICATIONS

The present application is a continuation of U.S. patent application Ser. No. 17/176,411, filed Feb. 16, 2021, which is a divisional of U.S. patent application Ser. No. 16/245,698, filed Jan. 11, 2019, the contents of which are hereby incorporated by reference in their entirety for all purposes.

TECHNICAL FIELD

The present technology relates to semiconductor processes and equipment. More specifically, the present technology relates to ceramic chamber components that may operate as system electrodes.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process. Such an etch process is said to be selective to the first material. As a result of the diversity of materials, circuits, and processes, etch processes have been developed with a selectivity towards a variety of materials.

Etch processes may be termed wet or dry based on the materials used in the process. For example, a wet etch may preferentially remove some oxide dielectrics over other dielectrics and materials. However, wet processes may have difficulty penetrating some constrained trenches and also may sometimes deform the remaining material. Dry etches produced in plasmas formed within the substrate processing region can penetrate more constrained trenches and exhibit less deformation of delicate remaining structures. However, plasmas may damage the substrate or chamber components through the production of electric arcs as they discharge, as well as through bombardment and etching of system components.

Thus, there is a need for improved systems and methods that can be used to produce high quality devices and structures. These and other needs are addressed by the present technology.

SUMMARY

Exemplary semiconductor processing chamber showerheads may include a dielectric plate characterized by a first surface and a second surface opposite the first surface. The dielectric plate may define a plurality of apertures through the dielectric plate. The dielectric plate may define a first annular channel in the first surface of the dielectric plate, and the first annular channel may extend about the plurality of apertures. The dielectric plate may define a second annular channel in the first surface of the dielectric plate. The second annular channel may be formed radially outward from the first annular channel. The showerheads may also include a conductive material embedded within the dielectric plate and extending about the plurality of apertures without being exposed by the apertures. The conductive material may be exposed at the second annular channel.

In some embodiments, the second annular channel may be defined within the dielectric plate to a greater depth than the first annular channel. The conductive material may extend through the dielectric plate at a depth within the dielectric plate greater than the depth of the first annular channel. The conductive material may be exposed by the second annular channel without being exposed by the first annular channel. The showerheads may also include an RF gasket seated within the second annular channel and configured to operate the conductive material as an electrode. The showerheads may also include an elastomeric element seated within the first annular channel. The conductive material may include a foil or mesh extending across an interior area of the showerhead defined by the first annular channel. The conductive material may include a plurality of tabs extending from the interior area of the showerhead to the second annular channel.

Some embodiments of the present technology may also encompass semiconductor processing chamber showerheads that may include a plate including a first dielectric material. The plate may be characterized by a first surface and a second surface opposite the first surface. The plate may define a plurality of apertures through the plate. The showerheads may include a conductive material disposed on the first surface of the plate, and the conductive material may be maintained at a first radial distance from each aperture of the plurality of apertures. The showerheads may also include a coating including a second dielectric material. The coating may extend across the conductive material, and the coating may be maintained at a second radial distance from each aperture of the plurality of apertures. The second radial distance may be less than the first radial distance.

In some embodiments, the conductive material may be exposed at a radial edge of the showerhead to provide electrical coupling of the showerhead. The showerhead may define an annular channel in the first surface of the plate radially outward of the plurality of apertures, and radially inward of the exposed conductive material at the radial edge of the showerhead. The coating may be or include a multi-layer coating. The first dielectric material and the second dielectric material may be or include different materials. The conductive material may be or include a perforated foil or mesh.

Some embodiments of the present technology may encompass semiconductor processing chambers having a lid and a substrate support. The chambers may also include a showerhead positioned between the lid and the substrate support. A first plasma region may be defined between the showerhead and the lid, and a second plasma region may be defined between the showerhead and the substrate support. The lid and the substrate support each may be coupled with a plasma-generating power source. The showerhead may be electrically coupled with ground, and the showerhead may include a plate including a first dielectric material. The plate may be characterized by a first surface and a second surface opposite the first surface. The plate may define a plurality of apertures through the plate, and the showerhead may defines a first annular channel in the first surface of the plate radially outward of the plurality of apertures. The showerhead may also include a conductive material incorporated with the plate. Exposure of the conductive material may be limited to a region radially outward of the first annular channel.

In some embodiments, the plate may define a second annular channel in the first surface of the plate. The second annular channel may be formed radially outward from the first annular channel, and the conductive material may be embedded within the plate and exposed by the second annular channel. The second annular channel may be defined within the plate to a greater depth than the first annular channel. The conductive material may extend through the plate at a depth within the plate greater than the depth of the first annular channel. The conductive material may be exposed by the second annular channel without being exposed by the first annular channel. The processing chambers may also include an RF gasket seated within the second annular channel and configured to electrically couple the conductive material to ground. The chambers may also include an elastomeric element seated within the first annular channel. The conductive material may be disposed on the first surface of the plate, and the conductive material may be maintained at a first radial distance from each aperture of the plurality of apertures. The showerheads may also include a coating that may be a second dielectric material. The coating may extend across the conductive material, and the coating may be maintained at a second radial distance from each aperture of the plurality of apertures. The second radial distance may be less than the first radial distance. The coating may be or include a multilayer coating. The conductive material may be or include a perforated foil or mesh.

Such technology may provide numerous benefits over conventional systems and techniques. For example, the showerheads may operate as a ground electrode during plasma processing. Additionally, the showerheads may limit metal bombardment with plasma species during plasma formation. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
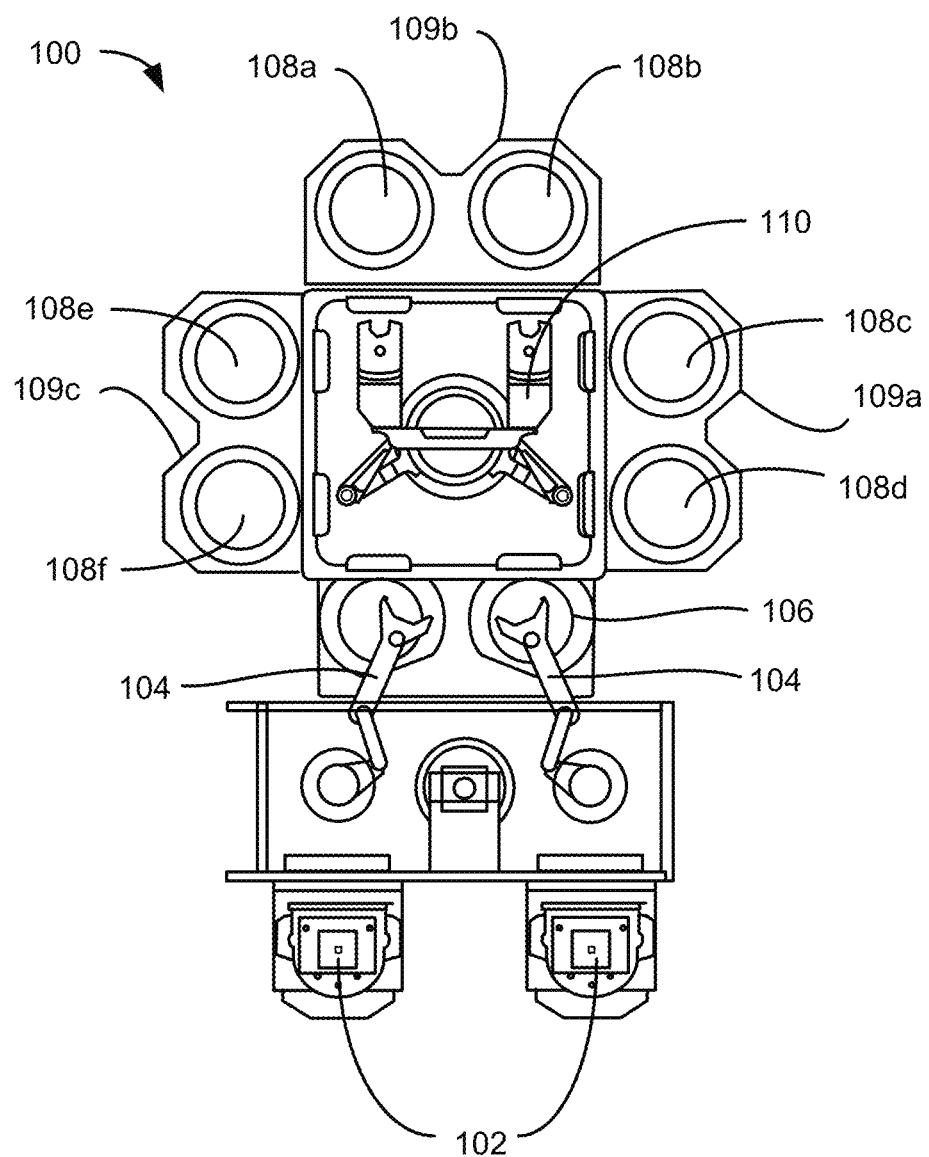
FIG. 1 shows a top plan view of one embodiment of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include additional or exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Dry etching processes may develop plasma species within certain regions of a processing region. Different plasma regions may include local regions, or areas proximate a substrate surface, as well as remote regions, such as in fluidly coupled but physically separated sections of a processing chamber. Many processing chambers include a number of different material components defining interior spaces within the chamber. For example, metallic components may be incorporated to operate as electrodes within the chamber, such as for capacitively-coupled plasma operations. Additionally, dielectric materials may be included to separate electrodes or operate as material coatings.

Showerheads that may operate as plasma electrodes, or may more generally assist in flow of plasma species, may be contacted and/or otherwise exposed to plasma effluents. Many etchant materials may interact with these electrodes, which may strip coatings or bombard exposed regions. As one non-limiting example, in some local or wafer-level plasma operations, a showerhead or manifold may operate as a ground electrode to develop plasma in the substrate processing region, where the substrate support or some other component may operate as the plasma-generating electrode. The showerhead operating as the ground electrode may be bombarded by plasma species, which on exposed metal may cause metallic species to contaminate the substrate, which could cause shorting during operation. Accordingly, some conventional designs may routinely exchange the showerhead or coat the showerhead with a material that may resist the bombardment.

The coatings used in some conventional designs may operate sufficiently against bombardment, or erosion, but may not sufficiently withstand a chemical reaction with plasma effluent species, which may cause corrosion of the coating. Accordingly, these components may routinely require re-coating or replacement. Moreover, many showerheads include a number of holes for delivering species through the chamber. If the coatings cannot completely coat every aperture sidewall and all exposed surfaces, plasma species that may be developed remotely may cause the same issues as species developed locally. Additionally, if the holes are not sufficiently small, local plasma may leak through these holes damaging other upstream components. However, when holes are formed sufficiently small, many line-of-sight coating devices are incapable of providing a complete coating within the holes. Hence, many conventional showerheads have been incapable of long-term, stable operation as electrodes.

The present technology overcomes these issues by utilizing dielectric or ceramic materials for the showerheads. Typically, ceramic materials cannot be used as electrodes due to their dielectric properties. The present technology incorporates one or more conductive materials within the ceramic, which allow the component to operate as an electrode. The conductive material may be contained within the ceramic or dielectric material in regions exposed to plasma, which may prevent contamination or bombardment issues described above. By utilizing particular materials for the components, showerheads having reduced aperture size may be produced that afford complete coverage of the conductive material. Additionally, the materials may resist erosion and/or corrosion from plasma exposure.

Although the remaining disclosure will routinely identify specific etching processes utilizing the disclosed technology, it will be readily understood that the systems and methods are equally applicable to deposition and cleaning processes and chambers as may occur in the described chambers or other chambers. Accordingly, the technology should not be considered to be so limited as for use with any particular etching processes or chambers alone. Moreover, although an exemplary chamber is described to provide foundation for the present technology, it is to be understood that the present technology can be applied to virtually any semiconductor processing chamber that may allow the operations described.

FIG. 1 shows a top plan view of one embodiment of a processing system 100 of deposition, etching, baking, and curing chambers according to embodiments. In the figure, a pair of front opening unified pods (FOUPs) 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation, and other substrate processes.

The substrate processing chambers 108a-f may include one or more system components for depositing, annealing, curing and/or etching a dielectric film on the substrate wafer. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to etch a dielectric film on the substrate. Any one or more of the processes described may be carried out in chamber(s) separated from the fabrication system shown in different embodiments. It will be appreciated that additional configurations of deposition, etching, annealing, and curing chambers for dielectric films are contemplated by system 100.

Figure 2A:
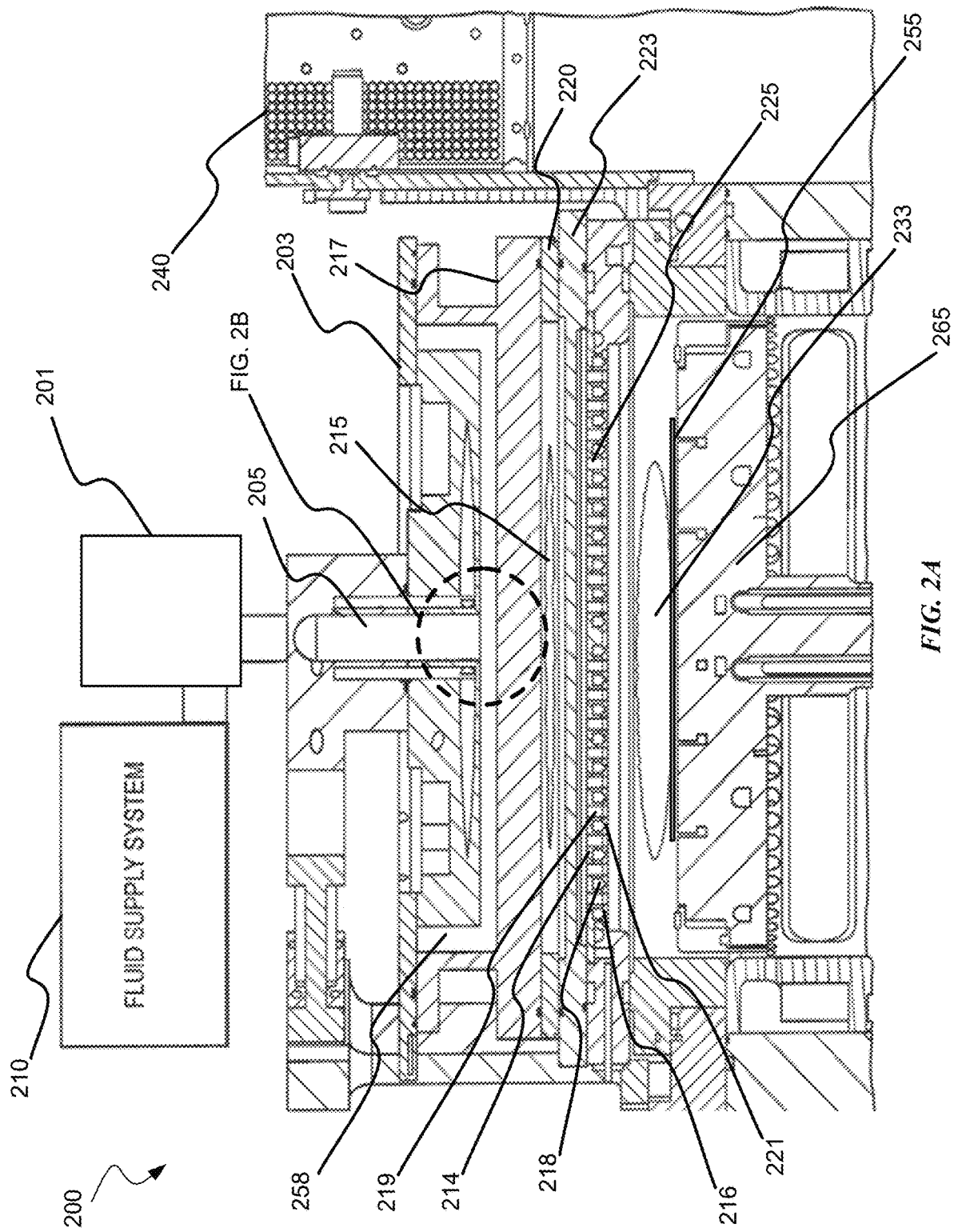
FIG. 2A shows a schematic cross-sectional view of an exemplary processing chamber according to some embodiments of the present technology.

FIG. 2A shows a cross-sectional view of an exemplary process chamber system 200 with partitioned plasma generation regions within the processing chamber. During film etching, e.g., titanium nitride, tantalum nitride, tungsten, silicon, polysilicon, silicon oxide, silicon nitride, silicon oxynitride, silicon oxycarbide, etc., a process gas may be flowed into the first plasma region 215 through a gas inlet assembly 205. A remote plasma system (RPS) 201 may optionally be included in the system, and may process a first gas which then travels through gas inlet assembly 205. The inlet assembly 205 may include two or more distinct gas supply channels where the second channel (not shown) may bypass the RPS 201, if included.

A cooling plate 203, faceplate 217, ion suppressor 223, showerhead 225, and a substrate support 265, having a substrate 255 disposed thereon, are shown and may each be included according to embodiments. The cooling plate and faceplate may operate as aspects of a lid assembly in some embodiments. The pedestal 265 may have a heat exchange channel through which a heat exchange fluid flows to control the temperature of the substrate, which may be operated to heat and/or cool the substrate or wafer during processing operations. The wafer support platter of the pedestal 265, which may include aluminum, ceramic, or a combination thereof, may also be resistively heated in order to achieve relatively high temperatures, such as from up to or about 100° C. to above or about 1100° C., using an embedded resistive heater element.

The faceplate 217 may be pyramidal, conical, or of another similar structure with a narrow top portion expanding to a wide bottom portion. The faceplate 217 may additionally be flat as shown and include a plurality of through-channels used to distribute process gases. Plasma generating gases and/or plasma excited species, depending on use of the RPS 201, may pass through a plurality of holes, shown in FIG. 2B, in faceplate 217 for a more uniform delivery into the first plasma region 215.

Exemplary configurations may include having the gas inlet assembly 205 open into a gas supply region 258 partitioned from the first plasma region 215 by faceplate 217 so that the gases/species flow through the holes in the faceplate 217 into the first plasma region 215. Structural and operational features may be selected to prevent significant backflow of plasma from the first plasma region 215 back into the supply region 258, gas inlet assembly 205, and fluid supply system 210. The faceplate 217, or a conductive top portion of the chamber, and showerhead 225 are shown with an insulating ring 220 located between the features, which allows an AC potential to be applied to the faceplate 217 relative to showerhead 225 and/or ion suppressor 223. The insulating ring 220 may be positioned between the faceplate 217 and the showerhead 225 and/or ion suppressor 223 enabling a capacitively coupled plasma (CCP) to be formed in the first plasma region. A baffle (not shown) may additionally be located in the first plasma region 215, or otherwise coupled with gas inlet assembly 205, to affect the flow of fluid into the region through gas inlet assembly 205.

The ion suppressor 223 may comprise a plate or other geometry that defines a plurality of apertures throughout the structure that are configured to suppress the migration of ionically-charged species out of the first plasma region 215 while allowing uncharged neutral or radical species to pass through the ion suppressor 223 into an activated gas delivery region between the suppressor and the showerhead. In embodiments, the ion suppressor 223 may comprise a perforated plate with a variety of aperture configurations. These uncharged species may include highly reactive species that are transported with less reactive carrier gas through the apertures. As noted above, the migration of ionic species through the holes may be reduced, and in some instances completely suppressed. Controlling the amount of ionic species passing through the ion suppressor 223 may advantageously provide increased control over the gas mixture brought into contact with the underlying wafer substrate, which in turn may increase control of the deposition and/or etch characteristics of the gas mixture. For example, adjustments in the ion concentration of the gas mixture can significantly alter its etch selectivity, e.g., SiNx:SiOx etch ratios, Si:SiOx etch ratios, etc. In alternative embodiments in which deposition is performed, it can also shift the balance of conformal-to-flowable style depositions for dielectric materials.

The plurality of apertures in the ion suppressor 223 may be configured to control the passage of the activated gas, i.e., the ionic, radical, and/or neutral species, through the ion suppressor 223. For example, the aspect ratio of the holes, or the hole diameter to length, and/or the geometry of the holes may be controlled so that the flow of ionically-charged species in the activated gas passing through the ion suppressor 223 is reduced. The holes in the ion suppressor 223 may include a tapered portion that faces the plasma excitation region 215, and a cylindrical portion that faces the showerhead 225. The cylindrical portion may be shaped and dimensioned to control the flow of ionic species passing to the showerhead 225. An adjustable electrical bias may also be applied to the ion suppressor 223 as an additional means to control the flow of ionic species through the suppressor.

The ion suppressor 223 may function to reduce or eliminate the amount of ionically charged species traveling from the plasma generation region to the substrate. Uncharged neutral and radical species may still pass through the openings in the ion suppressor to react with the substrate. It should be noted that the complete elimination of ionically charged species in the reaction region surrounding the substrate may not be performed in embodiments. In certain instances, ionic species are intended to reach the substrate in order to perform the etch and/or deposition process. In these instances, the ion suppressor may help to control the concentration of ionic species in the reaction region at a level that assists the process.

Showerhead 225 in combination with ion suppressor 223 may allow a plasma present in first plasma region 215 to avoid directly exciting gases in substrate processing region 233, while still allowing excited species to travel from chamber plasma region 215 into substrate processing region 233. In this way, the chamber may be configured to prevent the plasma from contacting a substrate 255 being etched. This may advantageously protect a variety of intricate structures and films patterned on the substrate, which may be damaged, dislocated, or otherwise warped if directly contacted by a generated plasma. Additionally, when plasma is allowed to contact the substrate or approach the substrate level, the rate at which oxide species etch may increase. Accordingly, if an exposed region of material is oxide, this material may be further protected by maintaining the plasma remotely from the substrate.

The processing system may further include a power supply 240 electrically coupled with the processing chamber to provide electric power to the faceplate 217, ion suppressor 223, showerhead 225, and/or pedestal 265 to generate a plasma in the first plasma region 215 or processing region 233. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to the plasma region 215. This in turn may allow development of particular plasma characteristics such that precursors may be dissociated in specific ways to enhance the etching profiles produced by these precursors.

A plasma may be ignited either in chamber plasma region 215 above showerhead 225 or substrate processing region 233 below showerhead 225. Plasma may be present in chamber plasma region 215 to produce the radical precursors from an inflow of, for example, a fluorine-containing precursor or other precursor. An AC voltage typically in the radio frequency (RF) range may be applied between the conductive top portion of the processing chamber, such as faceplate 217, and showerhead 225 and/or ion suppressor 223 to ignite a plasma in chamber plasma region 215 during deposition. An RF power supply may generate a high RF frequency of 13.56 MHz but may also generate other frequencies alone or in combination with the 13.56 MHz frequency.

Figure 2B:
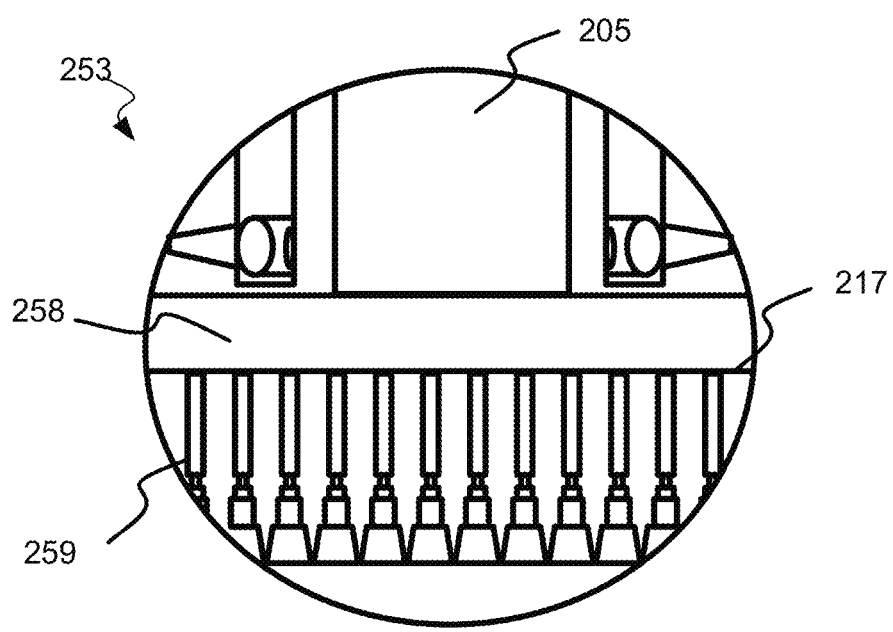
FIG. 2B shows a detailed schematic view of a portion of the processing chamber illustrated in FIG. 2A according to some embodiments of the present technology.

FIG. 2B shows a detailed view 253 of the features affecting the processing gas distribution through faceplate 217. As shown in FIGS. 2A and 2B, faceplate 217, cooling plate 203, and gas inlet assembly 205 intersect to define a gas supply region 258 into which process gases may be delivered from gas inlet 205. The gases may fill the gas supply region 258 and flow to first plasma region 215 through apertures 259 in faceplate 217. The apertures 259 may be configured to direct flow in a substantially unidirectional manner such that process gases may flow into processing region 233, but may be partially or fully prevented from backflow into the gas supply region 258 after traversing the faceplate 217.

Figure 3:
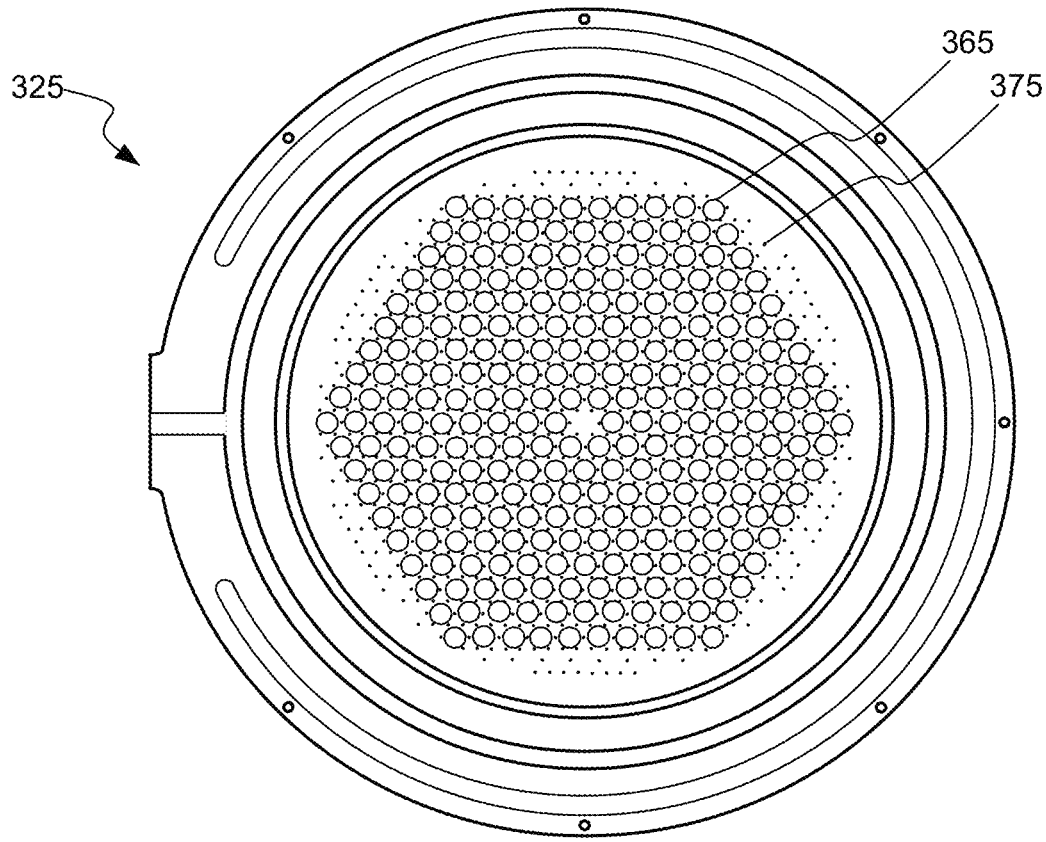
FIG. 3 shows a bottom plan view of an exemplary showerhead according to some embodiments of the present technology.

The gas distribution assemblies such as showerhead 225 for use in the processing chamber section 200 may be referred to as dual channel showerheads (DCSH) and are additionally detailed in the embodiments described in FIG. 3. The dual channel showerhead may provide for etching processes that allow for separation of etchants outside of the processing region 233 to provide limited interaction with chamber components and each other prior to being delivered into the processing region.

The showerhead 225 may comprise an upper plate 214 and a lower plate 216. The plates may be coupled with one another to define a volume 218 between the plates. The coupling of the plates may be so as to provide first fluid channels 219 through the upper and lower plates, and second fluid channels 221 through the lower plate 216. The formed channels may be configured to provide fluid access from the volume 218 through the lower plate 216 via second fluid channels 221 alone, and the first fluid channels 219 may be fluidly isolated from the volume 218 between the plates and the second fluid channels 221. The volume 218 may be fluidly accessible through a side of the gas distribution assembly 225.

FIG. 3 is a bottom view of a showerhead 325 for use with a processing chamber according to embodiments. Showerhead 325 may correspond with the showerhead 225 shown in FIG. 2A. Through-holes 365, which show a view of first fluid channels 219, may have a plurality of shapes and configurations in order to control and affect the flow of precursors through the showerhead 225. Small holes 375, which show a view of second fluid channels 221, may be distributed substantially evenly over the surface of the showerhead, even amongst the through-holes 365, and may help to provide more even mixing of the precursors as they exit the showerhead than other configurations.

Figure 4:
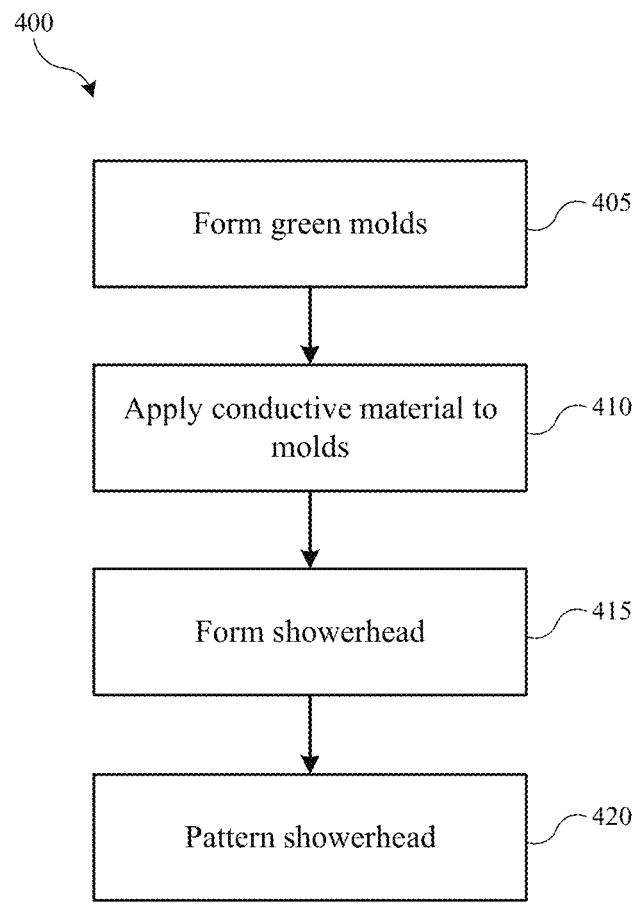
FIG. 4 shows exemplary operations in a method according to some embodiments of the present technology.

Turning to FIG. 4 is shown exemplary operations in a method 400 for producing a showerhead according to some embodiments of the present technology. As described above, some showerheads or chamber components that may operate as an electrode during plasma operation, including either a plasma-generating electrode or a ground electrode, may be formed of a ceramic or dielectric material, and may include a conductive material incorporated with or within the dielectric. Showerheads discussed throughout the present disclosure may be used as any of the components described previously including faceplates, ion suppressors, gas distribution assemblies, or other showerheads or manifolds used in chambers as described above, or any other chamber that may utilize such a component in plasma operations. Accordingly, although certain designs will be illustrated, it is to be understood that many different configurations are equally encompassed by the present technology.

In some embodiments the conductive material may be incorporated within or embedded within the showerhead during formation operations. Because some of the components described may be ceramic, the components may be formed in molding operations in which heat and/or pressure may be used to form the components. For example, sintering may be used to form the showerheads from one or more molded green bodies. In some embodiments of method 400 for producing a showerhead, green bodies may be formed in operation 405, such as two green bodies that may come together and be sintered to produce an exemplary showerhead. The green bodies may be disc-shaped, or may be characterized by any other shape so as to be seated in an exemplary processing chamber. The green bodies may be molded to include one or more plug holes or studs that may allow the two components to be coupled prior to a firing operation, and the bodies may include a few larger sets, or may include a number of studs and/or plug holes distributed between the bodies.

Once the green bodies have been formed, a conductive material may be applied or seated on one of the green bodies at operation 410. The conductive material may be a mesh, foil, or coating applied to one or both of the green bodies within a particular area as will be described below. The conductive material may be pre-formed to include apertures, which may be in a pattern similar to apertures that may be later drilled into the showerhead to provide gas flow. Exemplary showerheads may include tens, hundreds, or thousands of apertures, and thus the conductive material positioning may be performed to ensure that aperture formation may not expose the conductive material. As explained above, conductive material that may be exposed to plasma effluents may be etched, sputtered, or otherwise damaged by the plasma. Accordingly, development of exemplary showerheads may be performed to expressly limit exposure of the conductive material in regions where plasma exposure may occur.

For example, apertures may be formed or drilled through the completed ceramic. Accordingly, the conductive material may be formed or applied to the green bodies to include apertures that will allow the showerhead apertures to be produced without exposing the conductive material. In some embodiments, the conductive material itself may include apertures when it is positioned on the green bodies. For example, a foil may be produced that includes the apertures to be defined. Additional apertures may correspond to plug holes or studs for the green bodies, which may provide a locating function for the foil apertures for subsequent machining. As another example, because the green bodies may be molded, plug holes and studs may be distributed about the green body molds to correspond to where apertures may be produced, which may limit shifting during the firing operation. For example, a mesh or foil may be press-fit to the green body about the studs. Mesh tines may be separated about the studs, which may allow a consistent application of the conductive material across the mold, and limit sharp edges from cutting.

Once the conductive material has been applied, the green bodies may be fired to produce a showerhead in operation 415. The firing may include the application of heat and/or pressure to produce the ceramic component. Such a firing may include multiple operations including low-temperature heating followed by high-temperature heating, for example. After the component has been formed, the showerhead may be patterned in operation 420, which may provide apertures, channels, and other features during machining to produce a final showerhead. These produced showerheads may define a number of apertures in an interior region of the showerhead that may not expose the conductive material contained across the showerhead. Accordingly, the showerhead may operate as both a flow distribution component, as well as an electrode, while limiting or preventing conductive material from being exposed within the chamber processing regions.

Figure 5A:
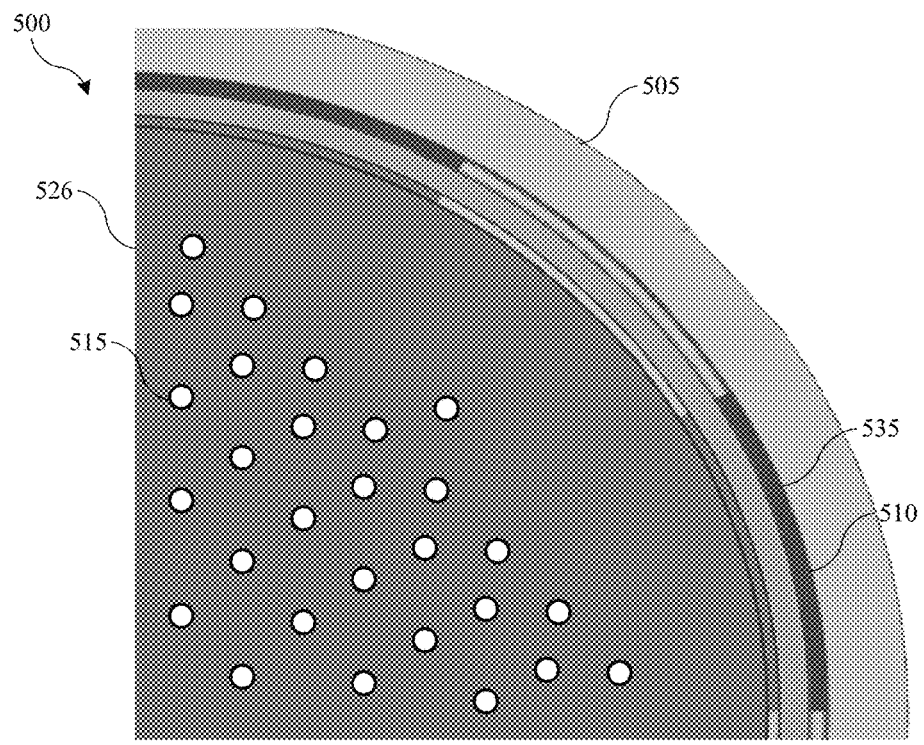
FIG. 5A shows a schematic partial top plan view of exemplary showerheads according to some embodiments of the present technology.
Figure 5B:
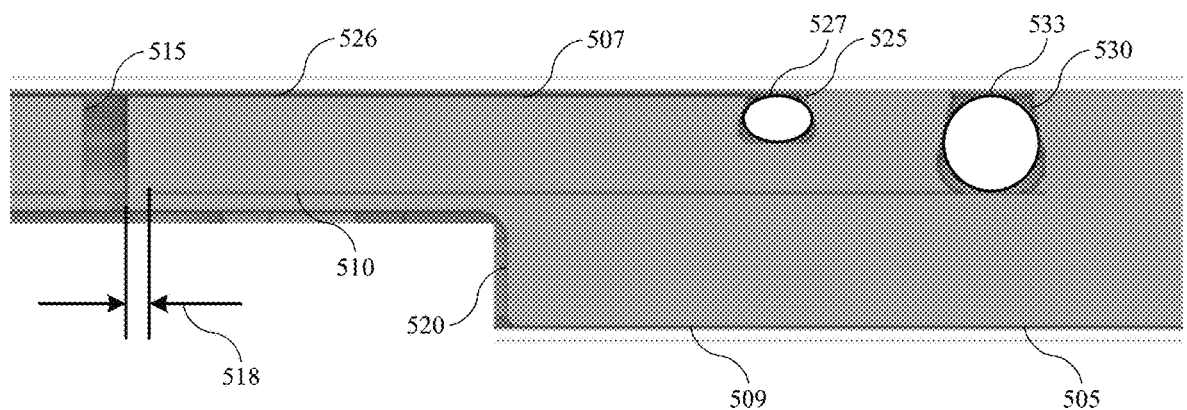
FIG. 5B shows a schematic partial cross-sectional view of exemplary showerheads according to some embodiments of the present technology.

FIG. 5A shows a schematic partial top plan view of exemplary showerhead 500 according to some embodiments of the present technology. The showerhead may include a dielectric plate 505, which may be a ceramic, for example, and the showerhead may also include an incorporated conductive material 510. FIG. 5B shows a schematic partial cross-sectional view of exemplary showerhead 500 according to some embodiments of the present technology, and may be considered with FIG. 5A to illustrate various features of the showerhead. As noted above, showerhead 500 is only one exemplary configuration of components encompassed by the present technology. Showerhead 500 illustrates features that may be included with various showerheads according to the present technology, but is not intended to limit other designs similarly encompassed. Showerhead 500 may be any of the manifolds discussed previously, and may be a single piece component, or in some embodiments may be one of a combination of components, such as to produce a gas distribution assembly as previously described. Showerhead 500 may be included in a semiconductor processing chamber as previously described, or any other processing chamber or system in embodiments of the present technology.

As shown, dielectric plate 505 may be a ceramic plate as formed by method 400 discussed above, or by any other method, and may include incorporated conductive material 510. Dielectric plate 505 may include a first surface 507 and a second surface 509, which may be opposite the first surface 507. Dielectric plate 505 may define a number of apertures 515 through the plate, which extend from the first surface 507 through the second surface 509, and may provide paths for precursors through the showerhead. Apertures 515 may be formed through the showerhead after sintering as described above, and after conductive material 510 has been incorporated. The apertures 515 may not contact or expose conductive material 510 in some embodiments. As illustrated, conductive material 510 may extend about some or all of apertures 515. As shown in FIG. 5B, conductive material 510 may maintain a separation or gap 518 about each aperture to ensure that the apertures do not expose the conductive material when formed.

Dielectric plate 505 may define one or more channels as well as one or more recessed features that may be machined subsequent incorporation of the conductive material 510. During sintering operations, material properties and characteristics may change, which may distribute the conductive material, foil, or mesh. For example, prior to firing, an exact depth of the conductive material 510 within the dielectric plate may be known. However, subsequent firing, this location may change slightly. Radial gap 518 may ensure that any lateral movement may be accommodated during aperture formation. However, because the conductive material may be only a few hundred nanometers in thickness in some embodiments, although any thickness may be used, slight changes in depth may challenge locating the conductive material for electrode coupling as well as for feature formation. For example, some exemplary showerheads may include recess 520 formed at an interior region of second surface 509. If the location of conductive material 510 has shifted during firing, conductive material 510 may inadvertently be exposed when recess 520 is formed. The present technology may perform locating in a number of ways to limit or prevent exposure of the conductive material in the dielectric plate.

Dielectric plate 505 may define a first annular channel 525 in the first surface 507 of dielectric plate 505. The first annular channel 525 may extend about the plurality of apertures 515, and may define an interior region 526 of the showerhead. First annular channel 525 may be configured to seat an o-ring or elastomeric element 527 for producing a seal during vacuum operations. Accordingly, interior region 526 may be a portion of the showerhead 500 that may be exposed within the chamber to any processing being performed, such as plasma processing, for example. In some embodiments, conductive material 510 may not be exposed anywhere in interior region 526, including where apertures 515 are formed.

Because conductive material 510 may be coupled as an electrode, the conductive material may be exposed in at least one location to provide coupling. In some embodiments, dielectric plate 505 may define a second annular channel 530 in the first surface 507 of dielectric plate 505. Second annular channel 530 may be configured to seat an RF gasket 533, or any other conductive connection that may contact conductive material 510. Second annular channel 530 may be formed radially outward from the first annular channel 525, and thus may be positioned in a location external from the processing regions of the chamber. Accordingly, second annular channel 530 may not be exposed to events occurring within the chamber, and may not be exposed to any plasma effluents, for example.

Conductive material 510 may be exposed in at least one location within second annular channel 530, and may be exposed in multiple locations within second annular channel 530. Because second annular channel 530 may be formed radially outward of first annular channel 525, conductive material 510 may extend past first annular channel 525. To prevent exposure of the conductive material in first annular channel 525, second annular channel 530 may be defined within the dielectric plate 505 to a greater depth than the first annular channel 525. Hence, as shown in FIG. 5B, conductive material 510 may extend past first annular channel 525 at a depth below first annular channel 525, which may prevent exposure of the conductive material at the first annular channel. When RF gasket 533 is seated within second annular channel 530, the gasket may contact conductive material 510 exposed within the channel, which may provide a path to operate the conductive material as an electrode within the chamber.

As noted above, the conductive material may be located within the dielectric plate to ensure the depth of the conductive material is known. Accordingly, in some embodiments second annular channel 530 may be machined or formed prior to other features of the showerhead. Conductive material 510 may extend completely to an outer region of the showerhead, or the conductive material 510 may include one or more wings or tabs 535 extending from a more uniform coverage in interior region 526 into an exterior region where exterior channel 530 may be formed. One or more locating holes or grooves may be formed down through the exterior region to locate the exact depth of the conductive material 510, such as between tabs 535 when included, for example. Once known, second annular channel 530 may be formed to fully expose conductive material 510 within the channel. Because the conductive material may extend about the showerhead, and RF gasket 533 or other electronic coupling may extend about the showerhead as well, any perforation of the conductive material in the exterior region during locating may not impact operation of the conductive material as an electrode due to the multiple points of contact about the showerhead.

Dielectric plate 505 may include any number of materials that may protect against bombardment from plasma species, and may be inert to plasma effluents, such as halogen-containing plasma effluents. For example, dielectric plate 505 may include oxides or nitrides of any number of metals including aluminum, yttrium, zirconium, silicon, or other elements or combinations. The conductive material may be any number of conductive materials that may operate or be used as an electrode, and may include aluminum, tungsten, molybdenum, tantalum, platinum, titanium, vanadium, or any other material including alloys of any of these or other conductive materials. While some embodiments as described below may not include sintering operations, when showerheads may be developed according to method 400, the firing temperatures may be well over 1,000° C. Accordingly, lower melting temperature metals, such as aluminum for example, may not be suitable candidates. Additionally, the ceramic material and conductive material may be selected to produce an amount of matching about the firing temperature to control expansion/contraction during the firing.

The dielectric plate may also be formed to control an amount of porosity of the showerhead produced. Because the components may be operating under vacuum conditions, porosity may be maintained relatively low to limit effects with vacuum conditions or outgassing with the showerhead. Similarly, components characterized by higher porosity may be susceptible to increased absorption of plasma species, which may require increased seasoning before processing is performed, for example. Accordingly, in some embodiments porosity of the material used for dielectric plate 505 may be limited below about 5%, and in some embodiments may be limited below or about 3%, below or about 2%, below or about 1%, below or about 0.9%, below or about 0.8%, below or about 0.7%, below or about 0.6%, below or about 0.5%, below or about 0.4%, below or about 0.3%, below or about 0.2%, below or about 0.1%, or less.

When apertures are formed prior to coating, such as with many metallic components, smaller apertures may not be feasible, or complete coating may not occur. However, the larger the apertures are formed to facilitate coating, the more likely plasma leakage is to occur. The present technology overcomes these issues because the apertures may only extend through dielectric plate 505 without contacting conductive material 510. Thus, because the issue with coating is overcome by using the ceramic material where aperture formation may not expose conductive material, smaller apertures may be drilled than in conventional materials where subsequent coating may be performed. Accordingly, in some embodiments apertures 515 may be characterized by a diameter of less than or about 10 mm, and in some embodiments may be characterized by a diameter of less than or about 9 mm, less than or about 8 mm, less than or about 7 mm, less than or about 6 mm, less than or about 5 mm, less than or about 4 mm, less than or about 3 mm, less than or about 2 mm, less than or about 1 mm, or less. The aperture sizes may impact gap 518 that may be maintained, along with the amount of travel that may be experienced during formation. Accordingly, gap 518, which may be a radial gap, may extend less than or about 5 mm about each aperture, and in some embodiments may extend less than or about 4 mm, less than or about 3 mm, less than or about 2 mm, less than or about 1 mm, less than or about 0.5 mm, or less about each aperture, which may ensure the conductive material is not exposed during formation of the apertures.

Figure 6:
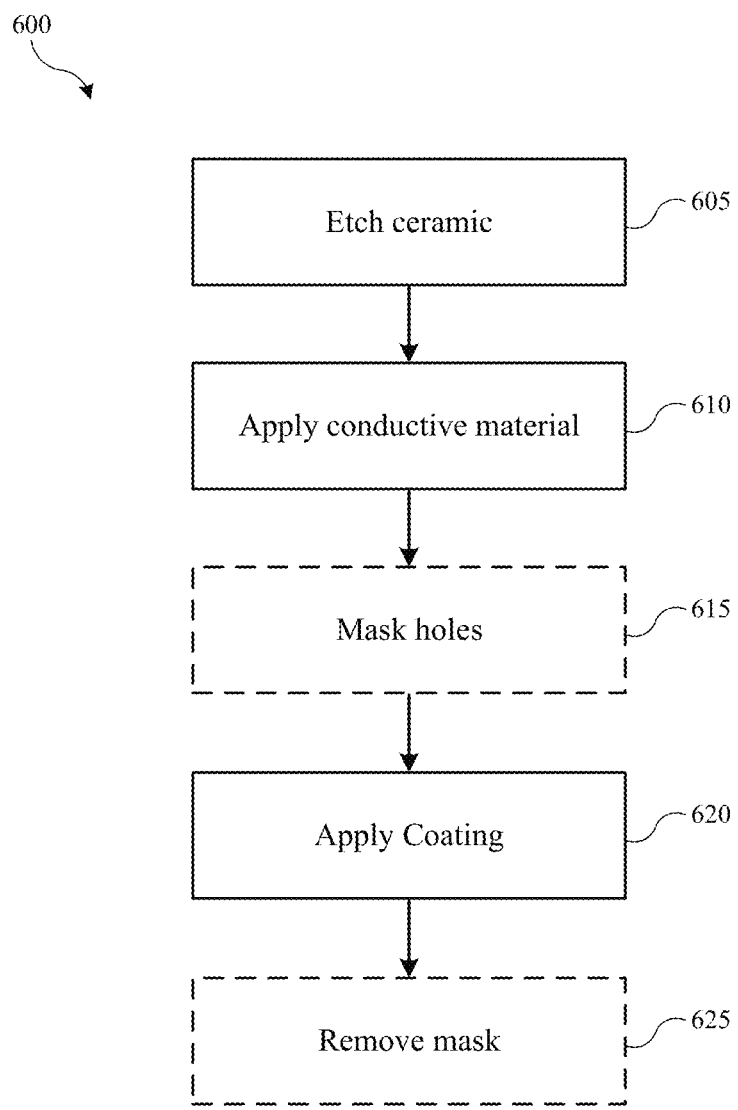
FIG. 6 shows exemplary operations in a method according to some embodiments of the present technology.

Showerheads according to the present technology may also include one or more coatings to limit or prevent exposure of conductive material to the interior chamber environment. FIG. 6 shows exemplary operations in a method 600 according to some embodiments of the present technology. Method 600 may produce showerheads similar to those discussed above, as well as other chamber manifolds or diffusers as previously described. Method 600 may include any of the operations of method 400 for producing a dielectric component, and showerheads produced may include any of the materials, properties, or characteristics as previously described.

Method 600, similar to method 400, may include one or more optional operations, which may or may not be specifically associated with some embodiments of methods according to the present technology. For example, many of the operations are described in order to provide a broader scope of the structural formation, but are not critical to the technology, or may be performed by alternative methodology as will be discussed further below. Method 600 describes operations shown schematically in top plan views of exemplary showerheads 700 in FIGS. 7A-7C, the illustrations of which will be described in conjunction with the operations of method 600. Showerhead 700 may similarly be incorporated in any processing chamber in embodiments of the present technology. It is to be understood that FIG. 7 illustrates only general schematic views for illustrative purposes, and exemplary showerheads may contain any number of apertures or structural elements as will be described.

Figure 7A:
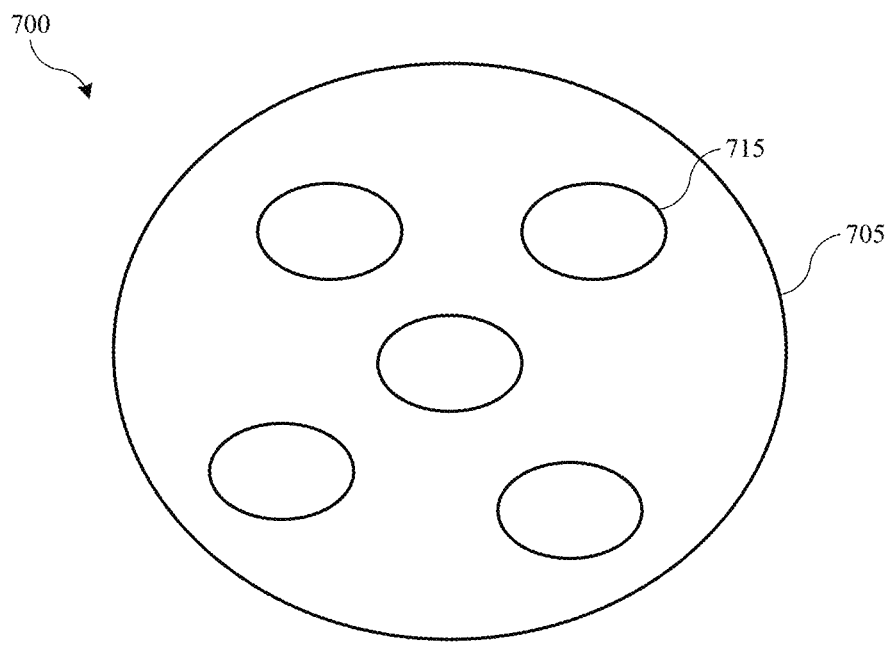
FIGS. 7A-7C show schematic top plan views of exemplary showerheads according to some embodiments of the present technology.
Figure 7B:
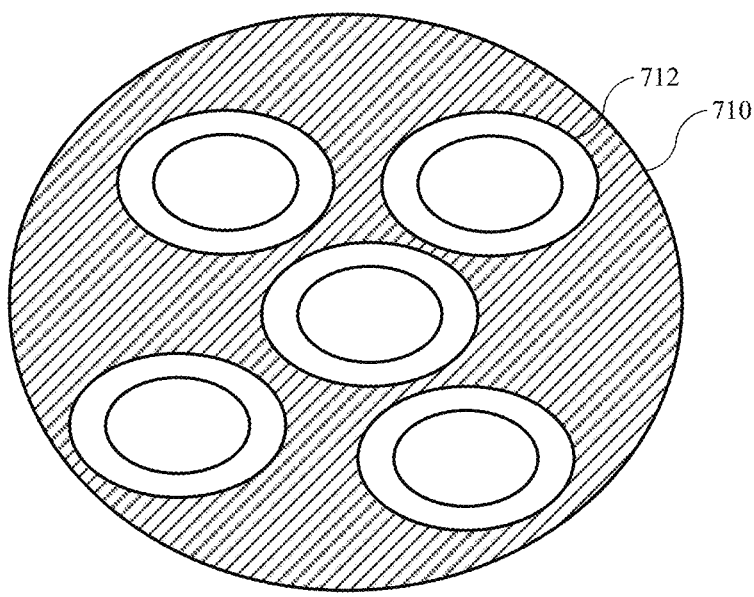

Method 600 may include etching a plate to produce apertures and other features at operation 605. For example, apertures may be drilled through a ceramic or dielectric plate, which may have any of the features, materials, or characteristics of showerhead 500 described above. As illustrated in FIG. 7A, apertures 715 may be drilled or formed through a dielectric plate 705 when producing showerhead 700. A mesh, foil, printing, or spray of a conductive or metal material may be applied to the plate on one or more surfaces at operation 610. The conductive materials may be any of the conductive materials as previously described, and may be positioned or formed on one or more surfaces, such as on a first surface of the showerhead. FIG. 7B shows the formation of conductive material 710 on a first surface of showerhead 700. As illustrated, conductive material 710 may extend across the first surface of the showerhead, although a gap 712 may be maintained about each aperture. For example, the conductive material may be maintained away from the apertures a first radial distance from each aperture, which may correspond to any gap distances described above. The gap 712 may perform a similar feature of ensuring that the conductive material may not be exposed, although the gap may also provide space for a subsequently added coating as will be described below. The gap may be included in pre-formed conductive materials, or another masking operation may be performed to produce the gap.

Figure 7C:
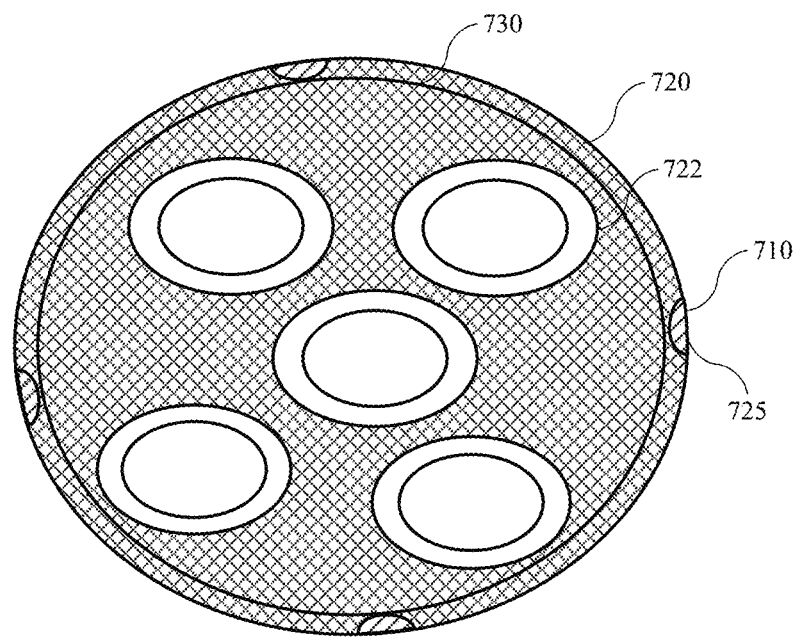

The formed apertures may then be masked at optional operation 615. The masking may be performed just about the holes and extend a limited distance radially or laterally about each aperture. A coating may then be applied at operation 620 to cover conductive material 710. After the coating has been applied, the mask may be removed in optional operation 625. The coating may also be a dielectric material, and may be a second dielectric material to a first dielectric material of the plate. FIG. 7C illustrates a showerhead subsequent application of the coating 720 to extend across conductive material 710. Coating 720 may also be applied to maintain a gap 722 from each aperture 715, and the coating 720 may be maintained a second radial distance from each aperture. In some embodiments the second radial distance may be less than the first radial distance, which may ensure that coating 720 completely covers conductive material 710.

FIG. 7C also shows that conductive material 710 may be exposed in one or more positions along an exterior or radial edge 725 of showerhead 700. The exposure may occur radially outward of an annular channel 730, which may be where an elastomeric element may be seated. The annular channel 730 may be defined radially outward of the apertures, and may define a boundary between an interior region of the showerhead that may be exposed within a chamber, and the exterior region which may not be exposed to chamber processing. Although shown in FIG. 7C, it is to be understood that the channel may have been formed previously during aperture formation to ensure continuity of the material to allow operation as an electrode. Accordingly, where the conductive material is exposed at region 725 may allow coupling for electrode operation, while limiting or preventing exposure of the conductive material within the chamber environment. In some embodiments a hybrid coating may be applied, and may include a first coating applied over the entire showerhead, while a second thicker coating, such as a second layer as described below, may not be applied to an edge region. The thinner coating may allow electrical connections through the coating because of the thickness, which may not fully insulate from electrical contact, although protecting from some plasma effluents. This option may provide additional flexibility during manufacturing in some embodiments.

Figure 7D:
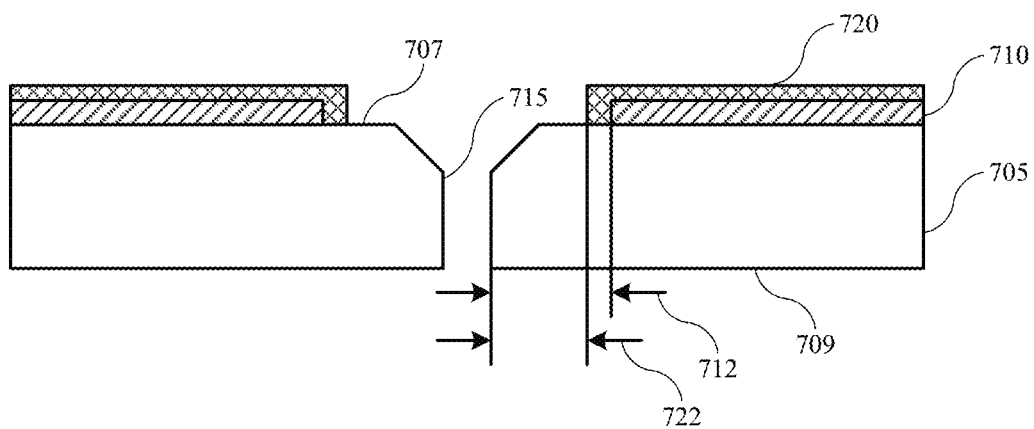
FIG. 7D shows a schematic partial cross-sectional view of exemplary showerheads according to some embodiments of the present technology.

FIG. 7D shows a schematic partial cross-sectional view of exemplary showerheads according to some embodiments of the present technology, and may illustrate another view of showerhead 700, for example. The figure shows a portion of the showerhead including dielectric plate 705, conductive material 710, and coating 720 as they may be formed about aperture 715. Aperture 715 is shown with a chamfered edge, but the figure is merely to illustrate that any aperture design may be accommodated with any of the present technology, and showerheads 500, 700, or any other showerhead produced may be characterized by any aperture profile.

FIG. 7D illustrates how conductive material 710 may be formed across a first surface 707 of plate 705. A second surface 709 opposite the first surface may not include conductive material or coating 720, although in some embodiments the second surface may also include one or more of the materials. For example, depending on the orientation of the showerhead or chamber component, one side of the component may be exposed more to bombardment, while one side may be exposed more to chemically reactive plasma effluents, and the coating may be applied accordingly, although as noted the coating may be applied to either or both sides of the showerhead. As illustrated, conductive material 710 may be maintained away from the aperture 715 to a first distance or gap 712. Coating 720 may be applied over the conductive material 710 and may be applied to a second distance or gap 722, which may be less than the first gap. Accordingly, conductive material 710 may be completely covered in an interior region of the showerhead in embodiments of the present technology.

Dielectric material for both the plate and the coating may be any of the materials previously described, and the conductive material may also be any of the previously noted materials. Additionally, coating 720 may be a type of hybrid or multilayer coating in some embodiments. For example, a first layer of coating 720 may be included to limit exposure of the conductive material to a second layer of coating, which may limit oxidation or other effects on the conductive material, for example.

Chambers according to some embodiments of the present technology may be used to perform modification operations in which a bias plasma may be formed in a substrate processing region. This operation may be a physical bombardment of structures on a substrate, and may utilize inert or less reactive precursors. Additionally, a reactive etch may be performed by producing reactive plasma effluents in a remote region. The precursors may include halogen precursors, which may be configured to remove modified material from a substrate. Accordingly, components of the chamber, such as showerheads described, may be exposed to both chemically reactive plasma effluents, such as fluorine, chlorine, or other halogen-containing effluents, as well as ions produced in the bias plasma used for physical modification. For example, exemplary showerheads may be exposed to both plasma effluents, such as bias plasma effluents contacting the surface facing the substrate and within apertures, as well as reactive effluents proceeding through apertures before interacting with a substrate. Other components described above may also be exposed to one or both plasma effluents, including from backstreaming plasma effluents. While conventional components may degrade due to conductive component exposure to the plasma materials, showerheads of the present technology may limit or prevent any conductive material exposure while still operating as plasma electrodes.

The plasma effluents may produce differing effects on the chamber components. For example, ions may be at least partially filtered by the showerhead from the chemically reactive plasma effluents produced remotely. However, the reactive effluents, such as fluorine-containing effluents, for example, may cause corrosion of exposed materials, such as by forming aluminum fluoride in conventional component designs. Over time, this process may corrode exposed metallic components, requiring replacement. Additionally, plasma species formed from a bias plasma in the substrate processing region may impact components causing physical damage and sputtering that may erode components over time. Accordingly, any of the described components may be susceptible to chemical corrosion as well as physical erosion from plasma effluents produced within one or more regions of the chamber.

Corrosion may be controlled in some ways by forming a coating 720 over materials, or using specific materials for the coating. For example, while aluminum may corrode from exposure to fluorine-containing plasma effluents, aluminum oxide, or other platings or coatings, may not corrode on contact with plasma effluents. Accordingly, any of the described components may be coated or protected by anodization, oxidation, atomic layer deposition, chemical vapor deposition, plasma spray, electroless nickel plating, electroplated nickel, barium titanate, or any other material that may protect exposed conductive materials, such as aluminum, molybdenum, platinum, or any of the previously noted materials, from chemical corrosion. Similarly, erosion may be controlled in some ways by forming a coating over materials or using certain materials for the base plate 705. For example, high performance materials such as yttrium oxide, which may or may not include additional materials including aluminum or zirconium, for example, may protect the component from physical damage caused by bias plasma effluents. Damage to components may still occur, however, when a structure may be contacted by both corrosive plasma effluents as well as erosive plasma effluents. Accordingly, coating 720 may include multiple materials as noted, and base plate 705 may include an additional coating as well. The materials may be the same, different, or combinations in embodiments. For example, coating 720 may include a plasma spray yttrium oxide in some embodiments along with any of the other materials noted to enhance resistance to plasma effluents.

Additionally, a first layer of a hybrid coating 720 may extend conformally across conductive material 710. As explained previously, the first layer may be a corrosion resistant layer, configured to protect the conductive material from reactive etchants, including halogen-containing effluents or etchant materials. The first layer may be or include an anodization, electroless nickel plating, electroplated nickel, aluminum oxide, or barium titanate in embodiments. Due to the formation process for corrosion resistant coatings, complete coverage of the conductive material may be achieved. A depth of coverage may be less than or about 25 µm, and may be less than or about 20 µm, less than or about 15 µm, less than or about 10 µm, less than or about 5 µm, less than or about 3 µm, less than or about 1 µm, less than or about 750 nm, less than or about 500 nm, less than or about 250 nm, less than or about 100 nm, less than or about 50 nm, or less. Because the time to achieve increased thickness may be relatively long in some embodiments, the coating thickness may be between about 100 nm and about 300 nm in some embodiments. In embodiments where the thickness of the first layer may be greater than or about 3 µm or about 5 µm, a second layer may not be included.

A second layer of the hybrid coating may also be included externally to the first layer. The second layer may include yttrium oxide, or other high performance materials, such as e-beam coating or yttrium oxide including aluminum, zirconium, or other materials. The second layer may extend at least partially across the first surface 707, and may extend across a plasma-facing surface of the component. The second layer of hybrid coating may be characterized by a thickness of less than or about 25 µm, and may be characterized by a thickness of less than or about 20 µm, less than or about 15 µm, less than or about 10 µm, less than or about 5 µm, less than or about 1 µm, less than or about 750 nm, less than or about 500 nm, less than or about 300 nm, less than or about 100 nm, or less in some embodiments.

As previously discussed, a masking operation may be performed prior to applying the coating 720. Because the coating may be applied by a spray mechanism in some embodiments, delivery through apertures that may be sized as previously noted may be difficult. If masking is not performed, the coating may not form a complete layer, and pitting formed from inconsistent coating may occur, which may facilitate removal of the coating during processing over time, and limit repeatability of application. Accordingly, masking may be performed in some embodiments where this may be an issue, and which may limit the coating to be expressly along the conductive material and first surface of the plate.

The plate 705 and/or conductive material 710 may be textured in some embodiments before formation of either or both of the first layer or the second layer of the coating, if two layers are used. For example, coatings may have improved adhesion to textured surfaces. In some embodiments, the texturing may be performed to a depth up to or greater than either or both layer depths of the hybrid coating. For example, prior to coating a first layer, or between the first and second layer coatings, the plate and/or conductive material may be textured via machining, bead or other blasting techniques, or other roughening or texturing operations. The texturing may be performed to a depth of at least about 50 nm, and may be performed to a depth of at least about 100 nm, at least about 250 nm, at least about 500 nm, at least about 750 nm, at least about 1 μm, at least about 3 μm, at least about 5 μm, or more, although the texturing may not extend to a depth greater than the overall thickness of the materials to limit exposure of underlying materials, and ensure coverage.

Figure 8:
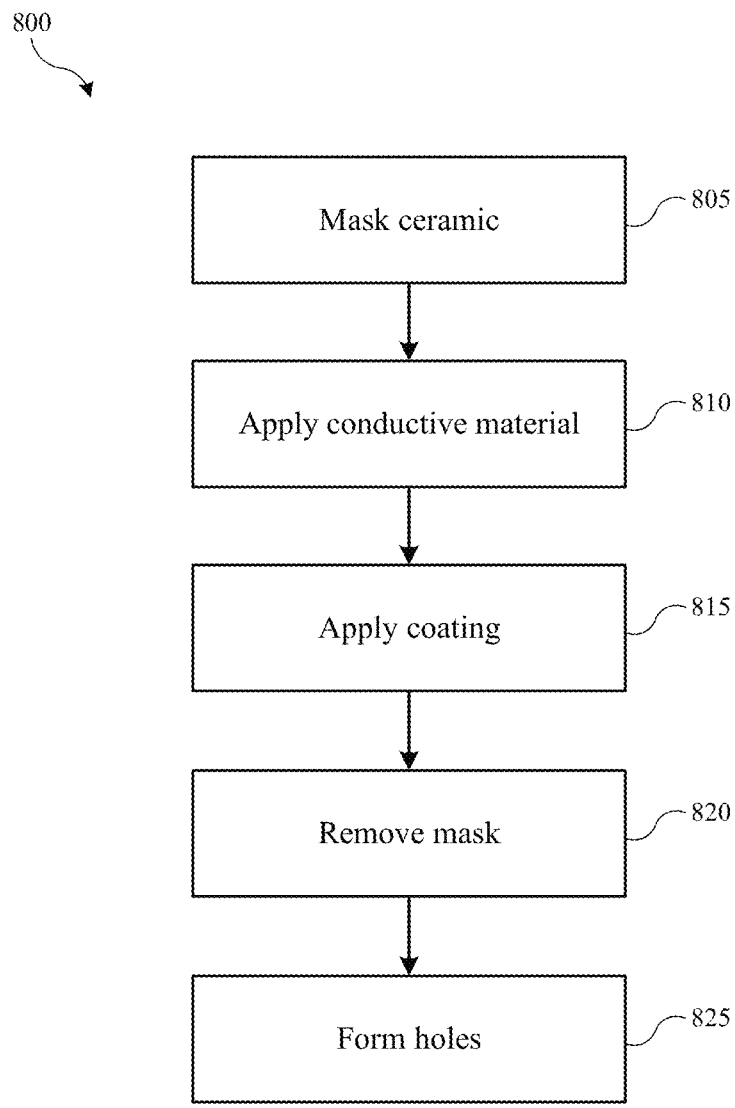
FIG. 8 shows exemplary operations in a method according to some embodiments of the present technology.

FIG. 8 shows exemplary operations in a method 800 according to some embodiments of the present technology. Method 800 may include a variation on the showerhead formation discussed above with method 600. The method will be described with reference to FIGS. 9A-9B, which show schematic top plan views of exemplary showerhead 900 according to some embodiments of the present technology. Method 800 may differ from method 600 in that apertures may be formed subsequently to coating in method 800. For example, method 800 may begin at operation 805 by forming a mask over a dielectric plate where apertures may be subsequently drilled. After masking, a conductive mesh, foil, or coating may be applied at operation 810, which may be performed by a number of previously noted techniques including metal printing or metal deposition, and which may occur as previously described, and may maintain a gap distance where the apertures will subsequently be formed. A coating may be applied over the conductive material at operation 815, which may maintain a second gap as discussed previously.

Figure 9A:
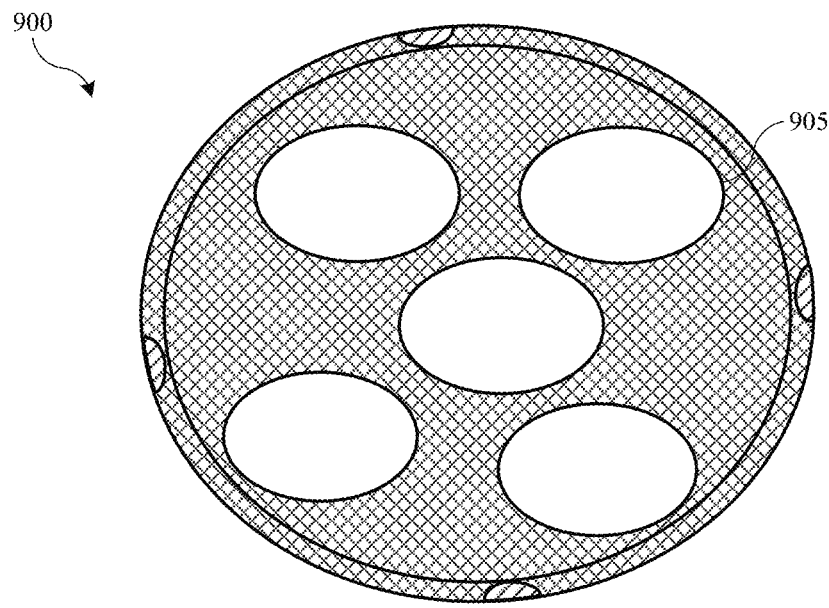
FIGS. 9A-9B show schematic top plan views of exemplary showerheads according to some embodiments of the present technology.
Figure 9B:
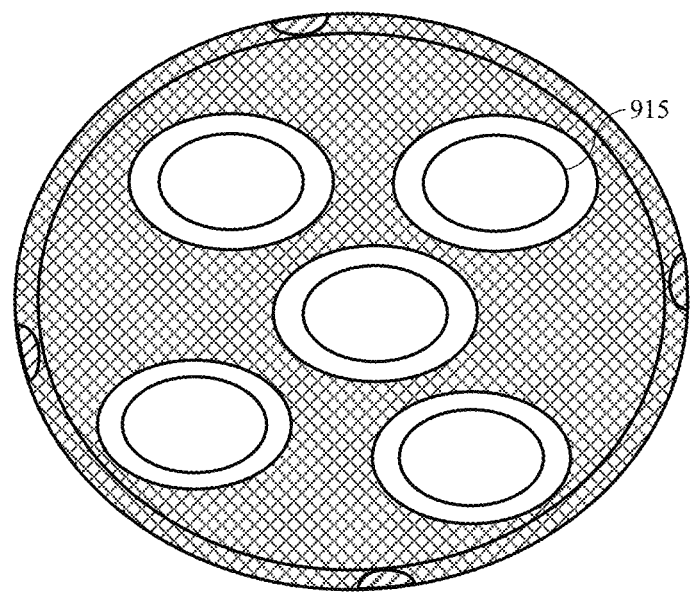

FIG. 9A may illustrate an exemplary showerhead subsequent coating at operation 815. As illustrated, showerhead 900 may resemble the showerhead discussed with FIG. 7, although apertures may not be formed through the plate 905. Mask material may be removed at operation 820, and then apertures may be machined through the plate at operation 825. As shown in FIG. 9B, the final showerhead may resemble the final showerhead of FIG. 7, although the apertures 915 were formed subsequent to coating.

Showerheads according to embodiments of the present technology may provide improved corrosion and erosion resistance over conventional showerheads that may be based on a conductive base material. By incorporating a conductive material with or within ceramic or other dielectric materials as described, operation as an electrode may still be afforded, while allowing reduced aperture sizes and improved coverage, including complete coverage, of conductive materials within the processing chamber.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of fabricating a showerhead for a semiconductor processing system, the method comprising: applying a electrically conductive material to a first surface of a dielectric plate, with the electrically conductive material being maintained a first radial distance away from each of a plurality of aperture locations of the dielectric plate; masking the plurality of aperture locations at a second radial distance away from each of the plurality of aperture locations; and applying a dielectric coating to an exposed portion of the electrically conductive material after masking the plurality of aperture locations.

2. The method of fabricating a showerhead for a semiconductor processing system of claim 1, further comprising:
forming a plurality of apertures through a thickness of the dielectric plate, wherein each aperture of the plurality of apertures is disposed at a respective one of the plurality of aperture locations.

3. The method of fabricating a showerhead for a semiconductor processing system of claim 2, wherein:
forming the plurality of apertures comprises one or both of drilling the plurality of apertures and etching the plurality of apertures.

4. The method of fabricating a showerhead for a semiconductor processing system of claim 2, wherein:
the plurality of apertures are formed prior to masking the plurality of aperture locations.

5. The method of fabricating a showerhead for a semiconductor processing system of claim 2, wherein:
the plurality of apertures are formed after applying the dielectric coating.

6. The method of fabricating a showerhead for a semiconductor processing system of claim 5, further comprising:
removing a mask of the masking prior to forming the plurality of apertures.

7. The method of fabricating a showerhead for a semiconductor processing system of claim 1, further comprising:
removing a mask of the masking after applying the dielectric coating.

8. The method of fabricating a showerhead for a semiconductor processing system of claim 1, wherein: the dielectric coating comprises: a first layer applied to the exposed portion of the electrically conductive material; and a second layer applied to a medial portion of the exposed surface while leaving an edge region of the exposed portion of the electrically conductive material devoid of the second layer.

9. The method of fabricating a showerhead for a semiconductor processing system of claim 8, wherein:
the first layer comprises at least one material selected from the group consisting of an anodization, electroless nickel plating, electroplated nickel, aluminum oxide, and barium titanate.

10. The method of fabricating a showerhead for a semiconductor processing system of claim 8, wherein:
a depth of the first layer is less than 25 microns.

11. The method of fabricating a showerhead for a semiconductor processing system of claim 8, wherein:
the second layer comprises at least one material selected from the group consisting of yttrium oxide, aluminum, and zirconium.

12. The method of fabricating a showerhead for a semiconductor processing system of claim 8, wherein:
a depth of the second layer is less than 25 microns.

13. The method of fabricating a showerhead for a semiconductor processing system of claim 8, wherein:
the second layer is thicker than the first layer.

14. The method of fabricating a showerhead for a semiconductor processing system of claim 1, wherein: applying the electrically conductive material comprises applying the electrically conductive material to one or more green bodies and firing the one or more green bodies and the electrically conductive material to form the dielectric plate with the conducive material applied to the first surface.

15. The method of fabricating a showerhead for a semiconductor processing system of claim 1, wherein:
the dielectric coating comprises yttrium oxide.

16. The method of fabricating a showerhead for a semiconductor processing system of claim 1, further comprising:
texturing one or both of the dielectric plate and the electrically conductive material prior to applying at least a portion of the dielectric coating.

17. The method of fabricating a showerhead for a semiconductor processing system of claim 16, wherein: the dielectric coating comprises: a first layer applied to the exposed portion of the electrically conductive material; and a second layer applied to a medial portion of the exposed surface while leaving an edge region of the exposed portion of the electrically conductive material devoid of the second layer; and a texture of the texturing is applied at a depth up to or greater than either or both of the first layer and the second layer.

18. The method of fabricating a showerhead for a semiconductor processing system of claim 16, wherein: texturing one or both of the dielectric plate and the electrically conductive material comprises one or both of machining and bead blasting.

19. The method of fabricating a showerhead for a semiconductor processing system of claim 16, wherein:
a texture of the texturing is applied to a depth of less than or equal to a thickness of the dielectric coating.

20. The method of fabricating a showerhead for a semiconductor processing system of claim 16, wherein:
the second radial distance is greater than the first radial distance.

* * * * *